(12) United States Patent
Nakamura et al.

(10) Patent No.: US 10,629,869 B2
(45) Date of Patent: Apr. 21, 2020

(54) ELECTRONIC APPARATUS CASE AND BATTERY PACK INCLUDING THE SAME

(71) Applicant: MURATA MANUFACTURING CO., LTD., Kyoto (JP)

(72) Inventors: Tsuyoshi Nakamura, Kyoto (JP); Masaaki Sugiyama, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 70 days.

(21) Appl. No.: 15/955,903

(22) Filed: Apr. 18, 2018

(65) Prior Publication Data

US 2018/0241017 A1    Aug. 23, 2018

Related U.S. Application Data

(63) Continuation of application No. PCT/JP2016/077626, filed on Sep. 20, 2016.

(30) Foreign Application Priority Data

Oct. 28, 2015   (JP) .............................. 2015-212390

(51) Int. Cl.
    *H01M 10/613*    (2014.01)
    *H01M 2/10*    (2006.01)
    *H01M 2/12*    (2006.01)
    *H05K 5/02*    (2006.01)
    (Continued)

(52) U.S. Cl.
    CPC .......... *H01M 2/1016* (2013.01); *H01M 2/022* (2013.01); *H01M 2/10* (2013.01); *H01M 2/105* (2013.01); *H01M 2/1264* (2013.01); *H01M 2/1294* (2013.01); *H01M 10/613* (2015.04);
    (Continued)

(58) Field of Classification Search
    CPC ......................... H01M 10/613; H01M 2/1055
    See application file for complete search history.

(56) References Cited

U.S. PATENT DOCUMENTS

5,620,057 A    4/1997    Klemen et al.
6,613,473 B1 *    9/2003    Tong ..................... H01M 2/105
                                                  429/154
(Continued)

FOREIGN PATENT DOCUMENTS

CN    102751457    10/2012
DE    20203258    8/2002
EP    2 131 264    12/2009
(Continued)

OTHER PUBLICATIONS

International Search Report and Written Opinion issued in connection with International Patent Application No. PCT/JP2016/077626, dated Dec. 20, 2016. (8 pages).
(Continued)

*Primary Examiner* — Olatunji A Godo
(74) *Attorney, Agent, or Firm* — K&L Gates LLP

(57) ABSTRACT

An electronic apparatus case including a ventilation portion on at least one side of the electronic apparatus case is provided. The ventilation portion further includes: an outer wall portion including a first ventilation port; an inner wall portion including a second ventilation port provided in a staggered manner with respect to the first ventilation port of the outer wall portion; and a discharge port provided between the outer wall portion and the inner wall portion.

17 Claims, 14 Drawing Sheets

(51) Int. Cl.
*H01M 2/02* (2006.01)
*H05K 7/20* (2006.01)
(52) U.S. Cl.
CPC ............. *H05K 5/02* (2013.01); *H05K 5/0213* (2013.01); *H05K 7/20* (2013.01)

(56) References Cited

U.S. PATENT DOCUMENTS

2008/0257639 A1  10/2008  Yamaguchi et al.
2012/0015227 A1* 1/2012  Hwang ............... H01M 2/1022
                                                    429/99

FOREIGN PATENT DOCUMENTS

| JP | 2001-147062 A | 5/2001 |
| JP | 2001-325995 | 11/2001 |
| JP | 2007-280858 A | 10/2007 |
| JP | 2008-269111 A | 11/2008 |
| JP | 2013-093487 A | 5/2013 |
| JP | 2013-208385 A | 10/2013 |
| JP | 2014-072020 A | 4/2014 |
| WO | 2014/030339 A2 | 2/2014 |

OTHER PUBLICATIONS

European Search Report dated Mar. 21, 2019 in corresponding European Application No. 16859438.0.
European Office Action dated Dec. 11, 2019 in corresponding European Application No. 16 859 438.0.

* cited by examiner

ELECTRONIC APPARATUS CASE AND BATTERY PACK INCLUDING THE SAME

CROSS REFERENCE TO RELATED APPLICATIONS

The present application is a continuation of PCT patent application no. PCT/JP2016/077626, filed Sep. 20, 2016, which claims priority to Japanese patent application no. JP2015-212390 filed on Oct. 28, 2015, the entire contents of which are being incorporated herein by reference.

BACKGROUND

The present technology generally relates to an electronic apparatus case and a battery pack including the electronic apparatus case.

In recent years, manganese dry batteries, alkaline manganese dry batteries, lithium primary batteries, nickel-cadmium batteries, nickel-metal hydride batteries, nickel-zinc batteries, lead batteries, lithium secondary batteries, etc. have been widely known as electric storage batteries. These electric storage batteries are housed in an airtight case and provided as a battery pack for the purpose of preventing leakage of an electrolytic solution and blocking contact between power generating elements of the electric storage battery and air.

In a conventional battery pack, it is known that gas is generated from a battery during charging and the internal pressure of the battery rises, when the battery is erroneously used or at the end of the life of the battery or the like. As a result, there is a risk that the battery will rupture. For this reason, in a conventional battery pack, a case in which a battery is housed is generally provided with a ventilation port for releasing the gas. Furthermore, the ventilation port is also provided for suppressing heat generation by use of a battery or for cooling a battery to be heat-generated.

In recent years, battery packs have been widely used, and are widely used for outdoor equipment such as rolling machines (rammers) and lawn mowers that require waterproof properties and dustproof properties. However, when a battery pack is applied to outdoor equipment, there is a possibility that foreign substances such as water and dust enter the battery pack via the ventilation port.

SUMMARY

The present technology generally relates to an electronic apparatus case and a battery pack including the electronic apparatus case. More particularly, the present technology relates to an electronic apparatus case having waterproof and dustproof functions while being provided with a ventilation port, and a battery packing including the same according to an embodiment.

According to an embodiment, an electronic apparatus case is provided. The electronic apparatus case includes a ventilation portion provided on at least one side of the electronic apparatus case. The ventilation portion includes an outer wall portion including a first ventilation port; an inner wall portion including a second ventilation port provided in a staggered manner with respect to the first ventilation port of the outer wall portion in a longitudinal direction of the outer wall portion; and a discharge port provided between the outer wall portion and the inner wall portion.

According to the present technology in an embodiment, the electronic apparatus case further includes an entry prevention portion configured to prevent foreign substances from entering on one or both of an edge of the ventilation port of the inner wall portion and an edge of the ventilation port of the outer wall portion.

According to the present technology in an embodiment, the electronic apparatus case is configured to have a filter member configured to reduce an entry speed of foreign substances, in which the filter member is opposite to one or both of the ventilation port of the inner wall portion and the ventilation port of the outer wall portion.

According to the present technology in an embodiment, the electronic apparatus case is configured to have a filter member configured to reduce an entry speed of foreign substances.

According to the present technology in an embodiment, the filter member is provided between the outer wall portion and the inner wall portion. According to the present technology in another embodiment, the filter member is configured to be opposite to only the ventilation port of the outer wall portion.

According to the present technology in an embodiment, the electronic apparatus case may include a pair of case bodies combined with each other, and the ventilation portion may be formed in at least one of the case bodies.

According to the present technology in an embodiment, the electronic apparatus case includes a pair of case bodies combined with each other, and the inner wall portion is provided separately from the pair of case bodies.

According to the present technology in an embodiment, the electronic apparatus case includes a pair of case bodies combined with each other, and the inner wall portion is provided integrally with one of the case bodies.

According to the present technology in an embodiment, the electronic apparatus case includes an entry prevention wall surrounding the discharge port.

According to the present technology in an embodiment, the entry prevention portion includes a protrusion shape.

According to the present technology in an embodiment, the entry prevention portion includes a stepped portion.

According to the present technology in an embodiment, a battery pack including an electronic apparatus case and a battery housed in the electronic apparatus case. The electronic apparatus case includes a ventilation portion provided on at least one side of the electronic apparatus case, and the ventilation portion includes an outer wall portion including a plurality of first ventilation ports; an inner wall portion including a plurality of second ventilation ports provided in a staggered manner with respect to the ventilation ports of the outer wall portion; and a discharge port provided between the outer wall portion and the inner wall portion.

According to the present technology in an embodiment, it is possible to provide an electronic apparatus case having waterproof and dustproof functions while being provided with a ventilation port for releasing the gas or cooling the battery or the like.

It should be understood that the present technology is not limited to waterproof and dustproof functions and that other suitable properties relating to the present technology may be realized and as further described herein.

DETAILED DESCRIPTION

The present disclosure generally relates to an electronic apparatus case and a battery pack including the electronic apparatus case. As described herein, embodiments of the present technology will be described below with reference to the drawings. The embodiments described below show an example of a representative embodiment of the present technology, and the scope of the present technology should not be narrowly construed by the embodiment.

Figure 1:
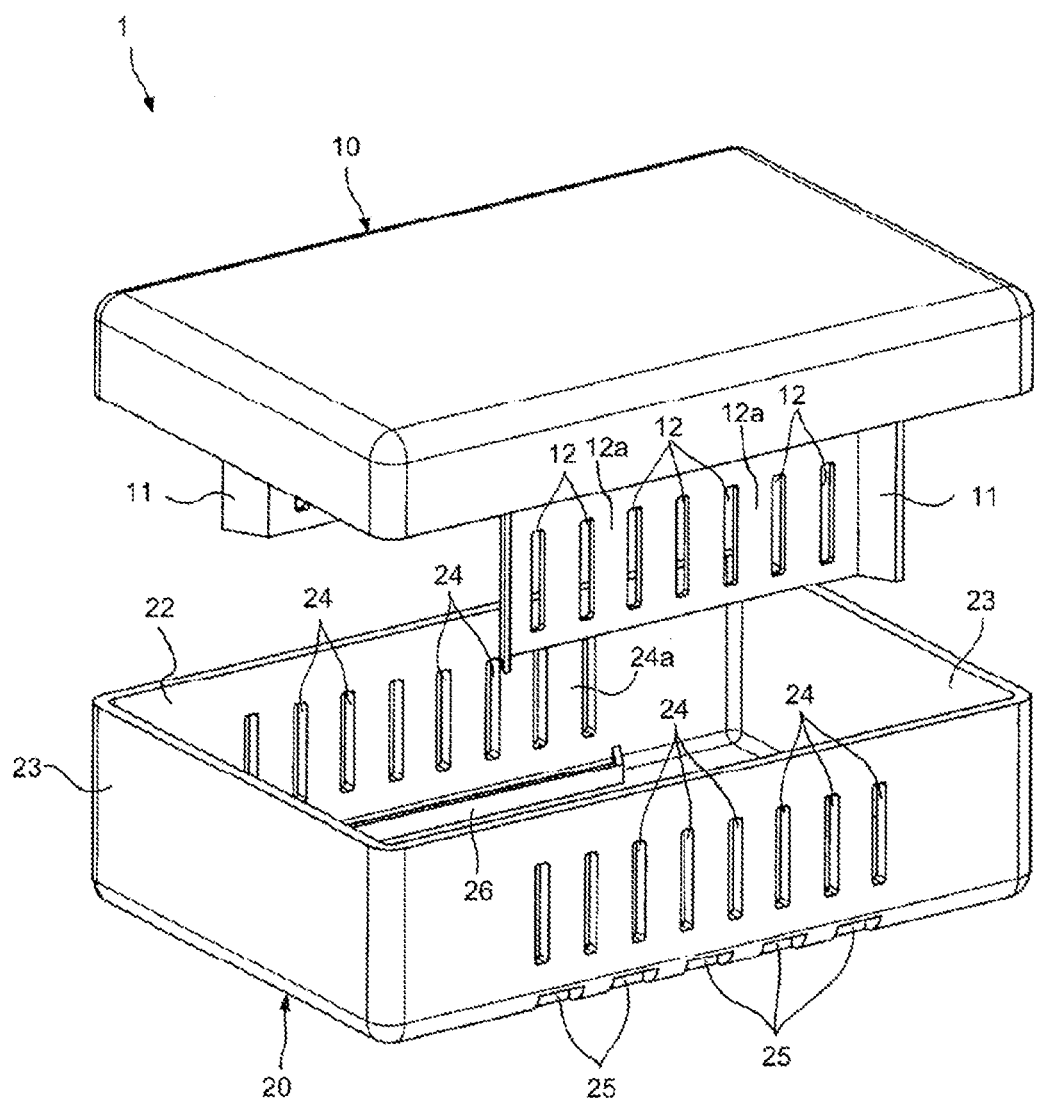
FIG. 1 is an exploded perspective view illustrating an example of a configuration of an electronic apparatus case according to an embodiment of the present technology.

FIG. 1 is an exploded perspective view showing an electronic apparatus case according to an embodiment of the present technology. The electronic apparatus case 1 includes at least a ventilation portion having both waterproof and dustproof functions, and houses an electronic apparatus such as an electric storage battery.

The electronic apparatus case 1 according to the embodiment is formed of a pair of case bodies 10, 20 combined with each other, and the ventilation portion is completed by combining the pair of case bodies 10, 20.

In the following description, the case body shown on the upper side of the paper is referred to as a first case body 10 and the case body shown on the lower side of the paper is referred to as a second case body 20 for convenience.

Figure 2:
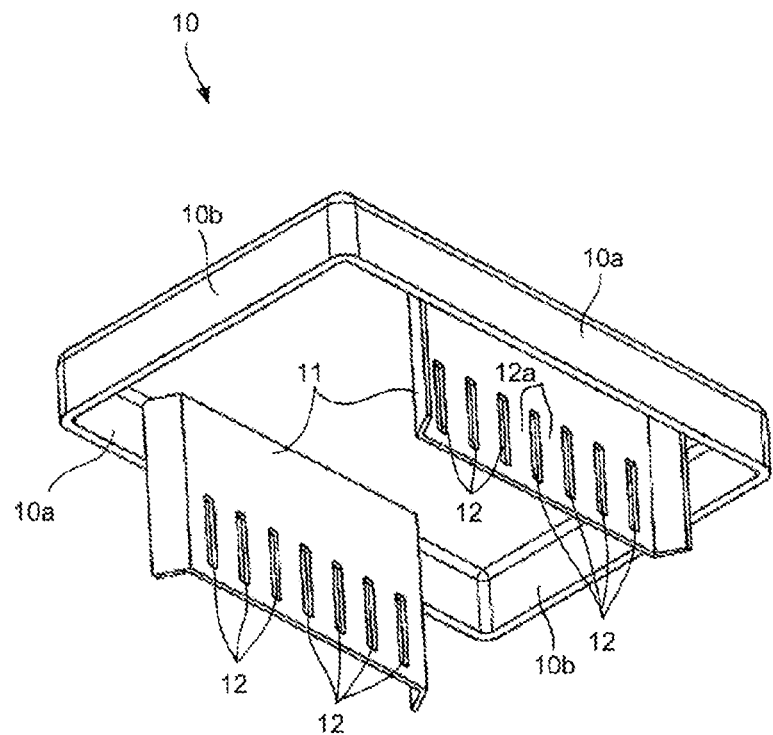
FIG. 2 is a perspective view illustrating a case body constituting the electronic apparatus case shown in FIG. 1 according to an embodiment.

The first case body 10, in an embodiment, will be described with reference to FIGS. 1 and 2. FIG. 2 is a perspective view of the first case body 10, and is a view of the first case body 10 observed from the side opposite to the second case body 20.

The first case body 10 is opened on its one surface, includes a pair of long side portions 10a formed along the longitudinal direction of the first case body 10 and a pair of short side portions 10b that cross the respective long side portions 10a and that are provided at end portions in the longitudinal direction of the first case body 10, and is formed into a box shape as a whole. In addition, the first case body 10 includes inner wall portions 11 opposite to the long side portions 10a.

Each of the inner wall portions 11 protrudes toward the second case body 20 from the bottom surface surrounded by the long side portions 10a and the short side portions 10b. A plurality of ventilation ports 12 are formed in each of the inner wall portions 11. The plurality of ventilation ports 12 are provided at predetermined intervals along the longitudinal direction of the first case body 10, and an intermediate wall portion 12a is provided between a pair of adjacent ventilation ports 12, 12. In addition, each of the ventilation ports 12 is formed into a long hole shape. Further, each of the ventilation ports 12 is formed penetratingly with respect to the inner wall portion 11, and each of the ventilation ports 12 opens toward a direction perpendicular to the longitudinal direction of the first case body 10.

A pair of the inner wall portions 11 is provided in the first case body 10 shown in FIGS. 1 and 2. In an embodiment, only one inner wall portion 11 is provided.

Further, in the first case body 10 shown in FIGS. 1 and 2, the inner wall portion 11 is formed so as to be opposite to the long side portion 10a of the first case body 10, but the inner wall portion 11 may be disposed so as to be opposite to the short side portion 10b.

In FIG. 1 and FIG. 2, seven ventilation ports 12 are formed in each of the inner wall portions 11; however, cooling of an electronic apparatus housed in the electronic apparatus case 1, releasing of gas generated from the electronic apparatus and the like may be performed through each of the ventilation ports 12, and the number of the ventilation ports 12 is not particularly limited.

Furthermore, in FIG. 1 and FIG. 2, each of the ventilation ports 12 is formed into a long hole shape; however, the shape of the ventilation port 12 is not particularly limited, and it may be appropriately changed according to the shape of a foreign substance that enters or the like.

Figure 3:
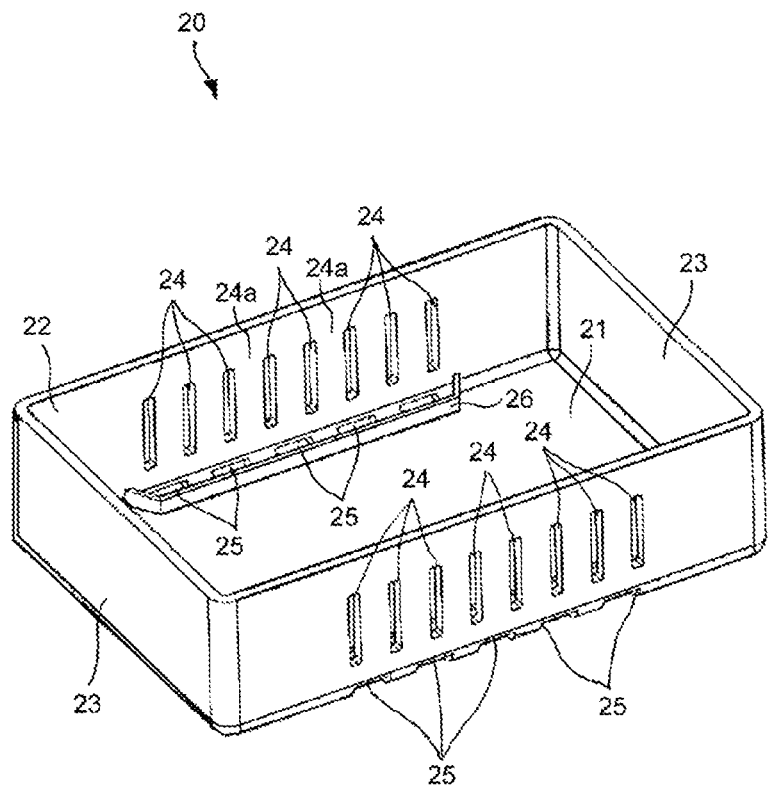
FIG. 3 is a perspective view illustrating a case body combined with the case body shown in FIG. 2 according to an embodiment.

Next, the second case body 20 will be described with reference to FIGS. 1 and 3. FIG. 3 is a perspective view of the second case body 20. As shown in FIGS. 1 and 3, the second case body 20 is formed into a box shape with one surface opened toward the first case body 10. More particularly, the second case body 20 includes a bottom surface portion 21 opposite to the first case body 10, a pair of long side portions 22 erected vertically from the bottom surface portion 21 and extending along the longitudinal direction of the second case body 20, and a pair of short side portions 23 that cross the pair of long side portions 22 and are erected from the bottom surface portion 21.

In the second case body 20, a plurality of ventilation ports 24 are formed in each of the long side portions 22. The plurality of ventilation ports 24 are provided at predetermined intervals along the longitudinal direction of the second case body 20, and an intermediate wall portion 24a is formed between a pair of adjacent ventilation ports 24, 24. Further, each of the ventilation ports 24 is formed into a long hole shape. Further, each of the ventilation ports 24 is formed penetratingly with respect to the long side portion 22, and further opens in a direction perpendicular to the longitudinal direction of the second case body 20.

Furthermore, the second case body 20 is provided with a plurality of discharge ports 25 for removing foreign substances entering the inside of the second case body 20.

In the electronic apparatus case 1 according to the embodiment shown in FIG. 3, each of the discharge ports 25 is formed penetratingly with respect to a corner where the bottom surface portion 21 and the long side portion 22 intersect with each other. Further, the plurality of the discharge ports 25 are formed at predetermined intervals along the longitudinal direction of the second case body 20, and furthermore, each of the discharge ports 25 is provided below the intermediate wall portion 24a.

In the second case body 20 according to an embodiment, an entry prevention wall 26 is provided to prevent foreign substances from entering the inside of the second case body 20. The entry prevention wall 26 protrudes from the bottom surface portion 21 of the second case body 20 and is formed so as to cover all of the discharge ports 25 formed at predetermined intervals along the longitudinal direction of the second case body 20.

That is, in the electronic apparatus case 1 according to the embodiment, the second case body 20 is provided with two entry prevention walls 26. Since FIG. 2 is a perspective view, only one entry prevention wall 26 is shown.

In the electronic apparatus case according to an embodiment of the present technology, the entry prevention wall 26 is not an essential component and may not be provided. In such a case, a configuration in which the entry prevention wall 26 is integrated with the inner wall portion 11 is conceivable.

In the electronic apparatus case 1 according to the embodiment shown in FIGS. 1 and 3, the ventilation ports 24 are formed in each of the long side portions 22, but the formation position of the ventilation ports 24 is not particularly limited, and for example, the ventilation ports 24 may be configured to be formed in one of the long side portions 22. Alternatively, in an embodiment, the ventilation ports 24 may be configured to be formed in the short side portions 23 instead of the long side portions 22. Along with this, the discharge ports 25 and the entry prevention wall 26 may also be configured to be formed in one of the long side portion 22, or may be configured to be formed in the short side portions 23.

In FIGS. 1 and 3, eight ventilation ports 24 are formed in each of the long side portions 22; however, cooling of an electronic apparatus housed in the electronic apparatus case 1, releasing of gas generated from the electronic apparatus and the like may be performed through each of the ventilation ports 24, and the number of the ventilation ports 24 is not particularly limited. The number of the discharge ports 25 may be appropriately increased or decreased in accordance with the change of the number of the ventilation ports 24 to be set.

Furthermore, in FIG. 1 and FIG. 3, each of the ventilation port 24 is formed into a long hole shape; however, the shape of the ventilation port 12 is not particularly limited, and it may be appropriately changed according to the shape of a foreign substance that enters or the like.

Next, with reference to FIGS. 4 to 6, a state where the first case body 10 is combined with the second case body 20 and a ventilation portion completed by the state will be described.

In the electronic apparatus case 1 according to an embodiment, the first case body 10 is combined with the second case body 20 in such a way that each of the inner wall portions 11 of the first case body 10 is inserted into the second case body 20.

In a state where the second case body 20 is combined with the first case body 10, an end surface of the long side portion 10a of the first case body 10 is configured to be in contact with an end surface of the long side portion 22 of the second case body 20, and an end surface of the short side portion 10b of the first case body 10 is configured to be in contact with an end surface of the short side portion 23 of the second case body 20.

Further, in a state where the case bodies 10, 20 are combined with each other, each of the inner wall portions 11 provided on the first case body 10 and each of the long side portions 22 provided on the second case body 20 are opposite to each other.

Figure 6:
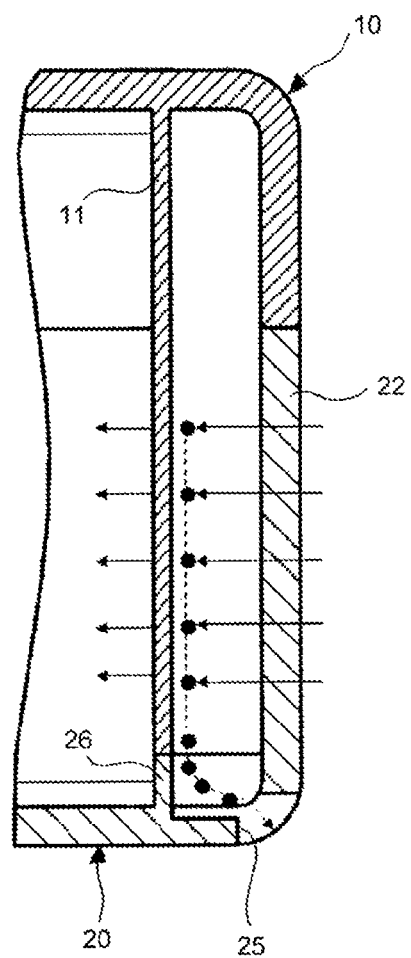
FIG. 6 is a schematic cross-sectional view of the operating state of the ventilation portion shown in FIG. 4 which is observed from a direction parallel to the longitudinal direction of the electronic apparatus case according to an embodiment.

In a state where the first case body 10 having the above-described configuration is combined with the second case body 20 having the above-described configuration, an end surface of each of the entry prevention walls 26 is joined with an end surface of each of the inner wall portions 11 formed on the first case body 10 (see FIG. 6). As a result, the inner wall portion 11 of the first case body 10 and each of the long side portions 22 provided in the second case body 20 define a space for housing the electronic apparatus, and a ventilation portion 3 including the inner wall portion 11, the long side portion 22 and the discharge ports 25 is completed. That is, in the electronic apparatus case 1 according to the first embodiment, the long side portion 22 corresponds to the outer wall portion according to the present technology.

Figure 4:
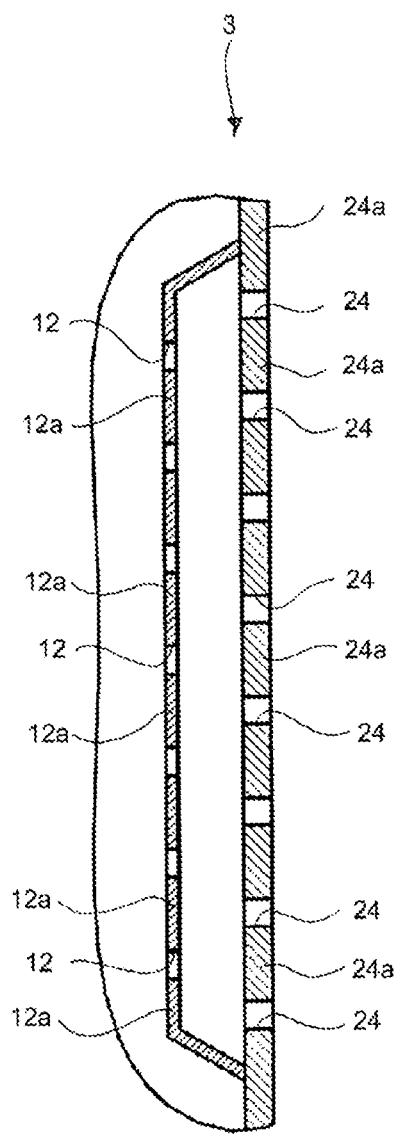
FIG. 4 is a cross-sectional view of a ventilation portion included in the electronic apparatus case shown in FIG. 1 according to an embodiment.

As shown in FIG. 4, in the ventilation portion 3 of the electronic apparatus case 1 according to an embodiment, the ventilation ports 12 of the inner wall portion 11 and the ventilation ports 24 of the long side portion 22 are formed in a staggered manner along the longitudinal direction (vertical direction in the paper) of the electronic apparatus case 1.

That is, in the ventilation portion 3, each of the ventilation ports 12 of the inner wall portion 11 is configured to be opposite to each of the intermediate wall portions 24a of the long side portion 22, and each of the ventilation ports 24 of the long side portion 22 is configured to be opposite to each of the intermediate wall portions 12a of the inner wall portion 11.

In the electronic apparatus case 1 according to an embodiment shown in FIG. 1, the ventilation portion 3 includes each of the ventilation ports 12 of the inner wall portion 11 and each of the ventilation ports 24 of the long side portion 22 alternately disposed in order of the ventilation port 12, the ventilation port 24 and the ventilation port 12 in the longitudinal direction of the long side portion 22; however, the electronic apparatus case according to an embodiment of the present technology may have a configuration such that the ventilation port formed in the inner wall portion is formed in a staggered manner with respect to the ventilation port formed in the outer wall portion, and at least the ventilation port 24 is opposite to the intermediate wall portion 12a of the inner wall portion 11. Therefore, for example, two ventilation ports 24 may be configured to be opposite to the intermediate wall portion 12a of the inner wall portion 11, and each of the ventilation ports may be formed in the order of the ventilation port 12, the ventilation port 24, the ventilation port 24, and the ventilation port 12 with respect to the longitudinal direction of the long side portion 22 according to an embodiment.

Furthermore, although the electronic apparatus case 1 according to an embodiment shown in FIG. 1 is formed of the first case body 10 and the second case body 20, the electronic apparatus case according to the present technology does not need to be formed of a pair of case bodies, and may include at least the ventilation portion 3. In such a case, for example, the electronic apparatus case 1 may have a structure of opening/closing an end surface in the longitudinal direction, and may be formed of one housing of the electronic apparatus case 1.

Next, with reference to FIG. 5 and FIG. 6, a path of entry of foreign substances when the foreign substances enter the inside of the electronic apparatus case 1 according to an embodiment will be described herein. Incidentally, black circles shown in FIGS. 5 and 6 indicate foreign substances.

When the electronic apparatus case 1 according to an embodiment is used outdoors, foreign substances such as external water splashes and dust can enter from the ventilation ports 24 provided in the second case body 20 to the inside of the electronic apparatus case 1.

In this case, the foreign substances having passed through the ventilation ports 24 collide with the intermediate wall portions 12a of the inner wall portion 11 to which the ventilation ports 24 are opposed.

The foreign substances having collided with the intermediate wall portions 12a fall downward in the ventilation portion 3 by their own weight, and finally passes through the discharge ports 25 provided in the second case body 20, and are discharged to the outside of the electronic apparatus case 1 (see FIG. 6).

Figure 5:
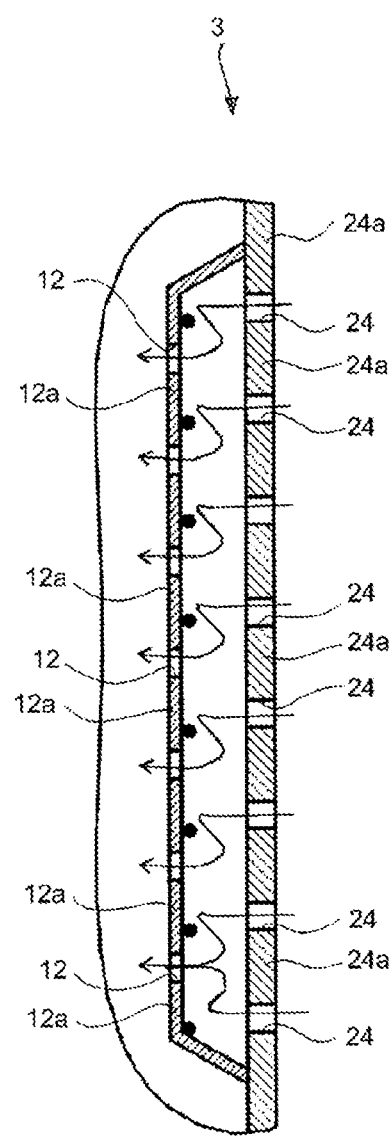
FIG. 5 is a schematic cross-sectional view of an operating state of the ventilation portion shown in FIG. 4 which is observed from a direction perpendicular to the longitudinal direction of the electronic apparatus case according to an embodiment.

On the other hand, even if external atmosphere having passed through the ventilation ports 24 of the long side portion 22 collides with the intermediate wall portions 12a, it can pass through the ventilation ports 12 provided in the inner wall portion 11 and enter the housing space of the electronic apparatus (see the arrow in FIG. 5).

In the electronic apparatus case 1 according to an embodiment configured as described herein, even if gas is generated from the electronic apparatus housed in the electronic apparatus case 1, the gas can be released to the outside of the electronic apparatus case 1 through the ventilation ports 12, 24 by the configuration of the ventilation portion 3. In addition to this, even if foreign substances enter the inside of the ventilation portion 3, it is possible to prevent the foreign substances from entering the housing space of the electronic apparatus via the ventilation ports 12 and to discharge the foreign substances to the outside of the electronic apparatus case 1 by the configuration of the ventilation portion 3.

Further, only the external atmosphere can be ventilated to the housing space of the electronic apparatus by providing the ventilation portion 3, so that heat generation of the electronic apparatus can be suppressed, or for example, the electronic apparatus that generates heat by continuous use can be cooled.

Next, a variation of the electronic apparatus case 1 according to an embodiment will be described with reference to FIGS. 7 and 8.

As described herein, according to an embodiment of the electronic apparatus case 1, the entry of a foreign substance can be prevented by the ventilation portion 3.

Since there is a possibility that the electronic apparatus housed in the electronic apparatus case 1 will be deteriorated by being in contact with a foreign substance, it is preferred to prevent entry of a foreign substance as much as possible.

Here, when a foreign substance enters the electronic apparatus case 1 at a high speed, there is also a possibility that a foreign substance having entered the ventilation portion 3 enters a housing space of the electronic apparatus in the electronic apparatus case 1 via the ventilation ports 12.

Therefore, the electronic apparatus case 1 according to an embodiment includes a filter member configured to reduce the entry speed of a foreign substance.

A filter member 4 according to an embodiment of the present technology may be a member that reduces the entry speed of a foreign substance, and examples thereof include mesh-like wire net, fibrous bodies such as felt and sponge, and porous body of foamed polyurethane, and the filter member has a configuration in which voids are contained therein.

In such a filter member 4, the entry speed of a foreign substance entering the electronic apparatus case is reduced by appropriately changing a void ratio of the filter member 4.

For example, under an environment where a fluid having high viscosity such as oil is scattered to the electronic apparatus case, a droplet speed of the fluid can be reduced with use of the filter member 4 by lowering the void ratio of the filter member 4 in consideration of the viscosity of the fluid to be scattered.

Figure 7:
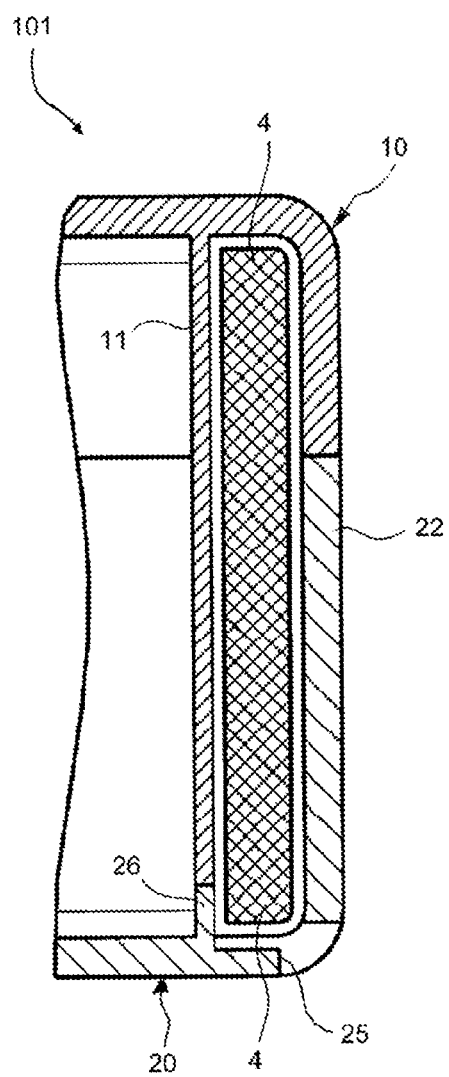
FIG. 7 is a partially enlarged view illustrating an embodiment of the electronic apparatus case shown in FIG. 1.

For example, as shown in FIG. 7, a configuration in which such a filter member 4 is disposed in a space formed between the long side portion 22 and the inner wall portion 11 opposite to the long side portion 22 is conceivable. In such a configuration, the filter member 4 is opposite to each of the ventilation ports 12 formed in the inner wall portion 11 and each of the ventilation ports 24 formed in the long side portion 22.

In a variation 101 of the electronic apparatus case according to an embodiment, foreign substances passing through the ventilation ports 24 of the long side portion 22 enter the inside of the filter member 4.

As a result, the entry speed of the foreign substances is reduced by the filter member 4, and the foreign substances travel downward within the filter member 4, and are finally discharged to the outside of the electronic apparatus case 1 through the discharge ports 25.

According to this variation 101, since the entry speed of the foreign substances is reduced by the filter member 4, it is possible to prevent the foreign substances from entering the housing space of the electronic apparatus of the electronic apparatus case 101 through the ventilation ports 12 of the inner wall portion 11 as much as possible.

Figure 8:
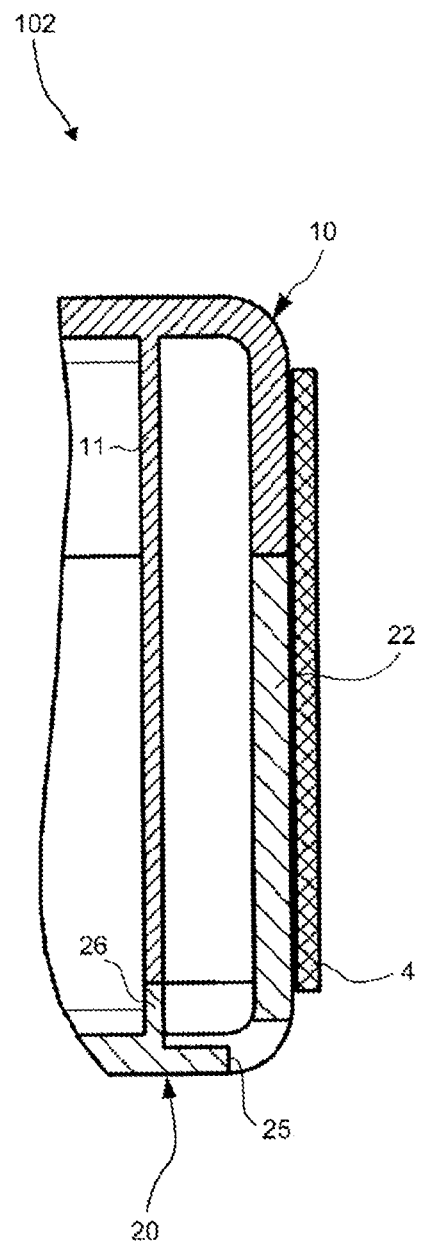
FIG. 8 is a partially enlarged view illustrating an embodiment of the electronic apparatus case shown in FIG. 1.

In the electronic apparatus case 1 according to an embodiment, the filter member 4 may be configured not only to be disposed between the long side portion 22 and the opposing inner wall portion 11 opposite to the long side portion 22, but also to be bonded to an outer side surface of the electronic apparatus case 1 as shown in FIG. 8. In this case, in order to prevent foreign substances from entering the housing space of the electronic apparatus, the filter member 4 is preferably disposed so as to cover all the ventilation ports 24 formed in the long side portion 22 of the second case body 20.

According to an embodiment of the variation 102 in which the filter member 4 is disposed as described herein, since the entry speed of foreign substances can be reduced outside the electronic apparatus case, it is possible to more reliably prevent the foreign substances from entering the inside of the electronic apparatus case.

In the electronic apparatus case according to an embodiment of the present technology, the disposition of the filter member 4 is not particularly limited, and it is also possible to provide the filter member 4 at two locations of, for example, a space formed between the long side portion 22 and the inner wall portion 11 opposite to the long side portion 22 and an outer side surface of the electronic apparatus case 1.

In the electronic apparatus case according to an embodiment of the present technology provided with such a filter member 4, there is a possibility that the filter member 4 may be clogged due to continuous use depending on the type of the foreign substances to be scattered, and ventilation of the external atmosphere may not be performed.

For this reason, with regard to the electronic apparatus cases 101, 102 shown in FIGS. 7 and 8, it is preferred that the filter member 4 is configured to be detachably attached to the electronic apparatus case.

The configuration for detachably attaching the filter member 4 is not particularly limited, and a publicly known structure can be used. As the herein configuration, the electronic apparatus case 101 shown in FIG. 7 may have a configuration of, for example, opening/closing a part of the first case body 10 or the second case body 20, and the filter member 4 can be replaced according to opening/closing.

Next, another embodiment of the electronic apparatus case according to the present technology will be described with reference to FIGS. 9 to 11. An electronic apparatus case 201 according to an embodiment is different from the electronic apparatus case 1 according to an embodiment in that an entry prevention portion is formed on the periphery of each of the ventilation ports 24 of the long side portion 22 and each of the ventilation ports 12 of the inner wall portion 11. On the other hand, the configuration of other portions is the same as that of the electronic apparatus case 1 according to the first embodiment.

Therefore, in the following description, the same components as those of the electronic apparatus case 1 according to an embodiment will not be described, and are denoted by the same reference numerals in the drawings.

Figure 9:
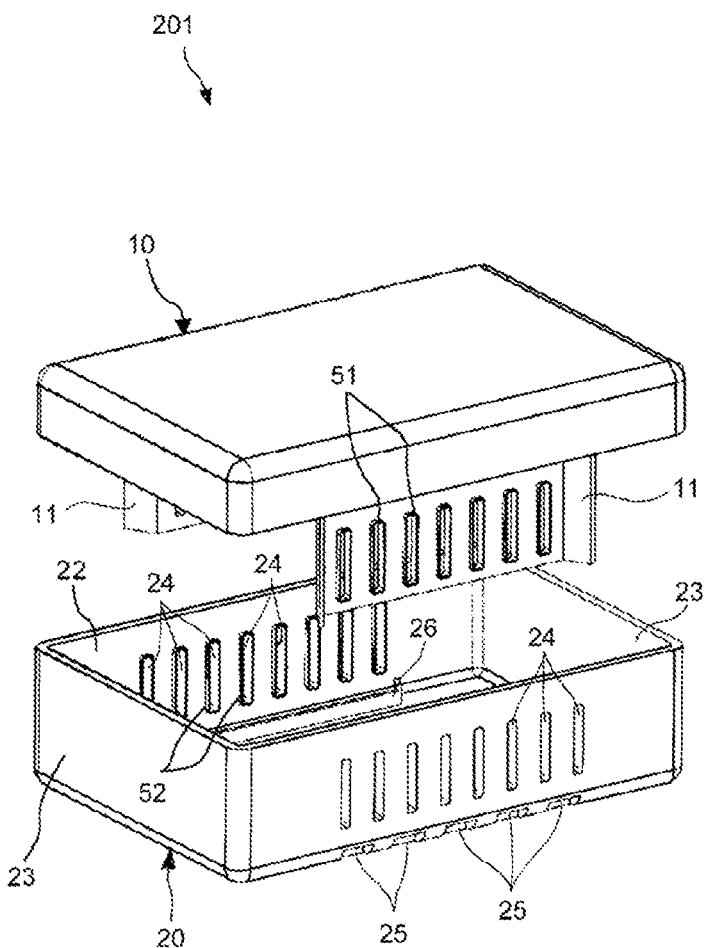
FIG. 9 is an exploded perspective view illustrating an electronic apparatus case according to an embodiment of the present technology.
Figure 10:
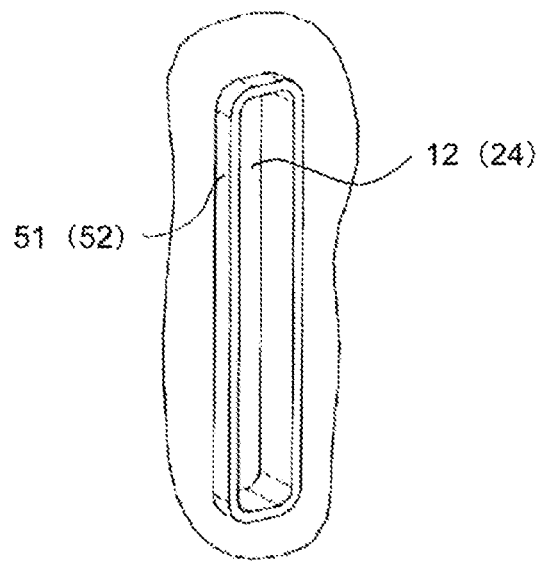
FIG. 10 is an enlarged perspective view illustrating an entry prevention portion included in the electronic apparatus case shown in FIG. 9 according to an embodiment.
Figure 11:
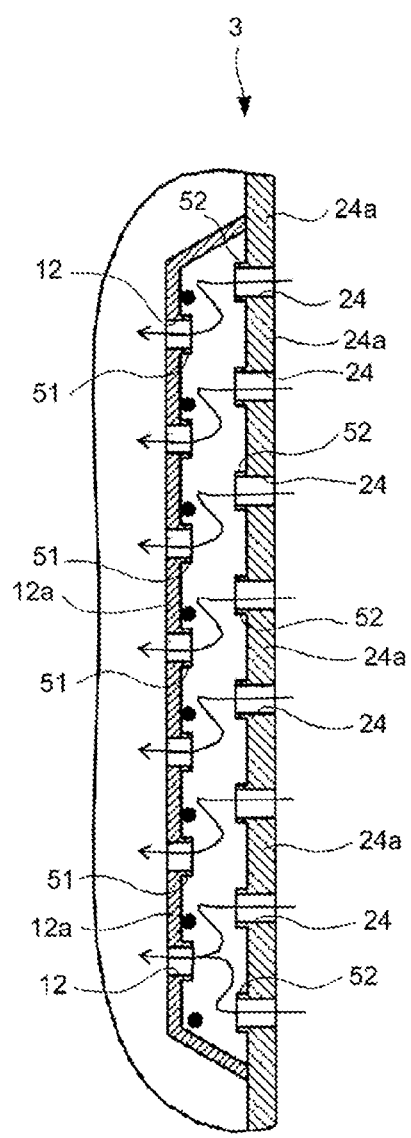
FIG. 11 is a schematic cross-sectional view of an operating state of the ventilation portion included in the electronic apparatus case shown in FIG. 9 which is observed from a direction perpendicular to the longitudinal direction of the electronic apparatus case according to an embodiment.

FIG. 9 is an exploded perspective view of the electronic apparatus case 201 according to an embodiment, FIG. 10 is a perspective view showing the entry prevention portion, and FIG. 11 is a schematic perspective view showing the operating state of the entry prevention portion which is observed from a direction perpendicular to the longitudinal direction of the electronic apparatus case.

In the electronic apparatus case 201 according to an embodiment, entry preventing portions 51 are formed on the entire circumferences of edges of the ventilation ports 12 provided in the inner wall portion 11. The entry prevention portions 51 formed at the edges of the ventilation ports 12 are each formed into a protrusion shape which protrudes toward the long side portion 22 of the second case body 20.

On the other hand, in the electronic apparatus case 201 according to an embodiment, as shown in FIG. 9, entry prevention portions 52 are also formed on the entire circumferences of edges of the ventilation ports 24 formed in the long side portion 22 of the second case body 20.

Each of the entry prevention portions 52 is formed into a protrusion shape which protrudes toward the inner wall portion 11 of the first case body 10.

As shown in FIG. 11, in the electronic apparatus case 201 according to an embodiment including the entry prevention portions 51, 52 configured as described herein, when foreign substances enter the inside of the ventilation portion 13 through the ventilation ports 24 formed in the long side portion 22, the foreign substances collide with the intermediate wall portions 12a of the inner wall portion 11. The foreign substances colliding with the intermediate wall portions 12a are prevented from entering the ventilation ports 12 by the entry prevention portions 52 formed in the inner wall portion 11.

That is, in the electronic apparatus case 201 according to an embodiment, it is possible to prevent the foreign substances from entering the housing space of the electronic apparatus via the ventilation ports 12 by the entry preventing portions 52 as much as possible.

In addition, in the electronic apparatus case 201 according to an embodiment, the entry direction of the foreign substances having passed through the ventilation ports 24 is controlled by the entry prevention portions 52, and the foreign substances are positively guided to the intermediate wall portions 12a formed in the inner wall portion 11.

That is, the entry prevention portions 52 can also prevent the foreign substances having passed through the ventilation ports 24 from entering the ventilation ports 12 formed in the inner wall portion 11 as much as possible.

In the electronic apparatus case 201 according to an embodiment shown in FIG. 9, the entry prevention portions 51, 52 are formed in both the inner wall portion 11 and the long side portion 22, but the entry prevention portions 51, 52 may be formed on at least one of the inner wall portion 11 and the long side portion 22.

In the electronic apparatus case 201 according to an embodiment shown in FIG. 9, each of the entry preventing portions 51, 52 is formed into a protrusion shape; however, the shape of each of the entry prevention portions 51 and 52 is not particularly limited, and other shapes can be adopted as long as the entry preventing portions 51, 52 can prevent foreign substances having passed through the ventilation ports 24 from entering the ventilation ports 24. In this case, for example, the entry preventing portions 51, 52 may be formed as a stepped portion. Further, these entry prevention portions 51, 52 may be formed into a groove shape to positively allow foreign substances to enter the entry prevention portions 51, 52.

Furthermore, in the electronic apparatus case 201 according to an embodiment, the entry prevention portions 51, 52 are provided on the entire circumference of the edges of the ventilation ports 12, 24; however, this configuration is not particularly limited as long as the entry prevention portions 51, 52 can prevent foreign substances having passed through the ventilation ports 24 from entering the ventilation ports 24. For example, the entry prevention portion may be configured to be formed on a part of the edge of each of the ventilation ports 12, 24. However, in order to more reliably prevent the foreign substances from entering the housing space of the electronic apparatus through the ventilation ports 12, the entry prevention portions 51, 52 are preferably provided on the entire circumference of the edges of the ventilation ports 12, 24.

In addition, in the electronic apparatus case 201 according to an embodiment, the protrusion length of each of the entry prevention portions 51, 52 is not particularly limited as long as the entry prevention portions 51, 52 can prevent foreign substances having passed through the ventilation ports 24 from entering the ventilation ports 24. However, when the protrusion length of the entry prevention portion 51 is set to such an extent that the entry prevention portion 51 is joined to the intermediate wall portion 24*a* and the protrusion length of the entry prevention portion 52 is set to such an extent that the entry prevention portion 52 is joined to the intermediate wall portion wall portion 12*a*, it is not preferred since there is a possibility that the flow of external atmosphere via the ventilation ports 12, 24 may be interrupted.

Next, the electronic apparatus case according to an embodiment of the present technology will be described with reference to FIG. 12. An electronic apparatus case 301 according to an embodiment is different from the electronic apparatus case 1 according to an embodiment in that the inner wall portions 11 are provided in the second case body 20 and that a plurality of the ventilation ports 24 are opposite to the intermediate wall portions 12*a* of each of the inner wall portions 11. On the other hand, the structures of components themselves are the same as those in the electronic apparatus case 1 according to an embodiment.

Therefore, in the following description, the same components as those of the electronic apparatus case 1 according to an embodiment will not be described, and are denoted by the same reference numerals in the drawings.

Figure 12:
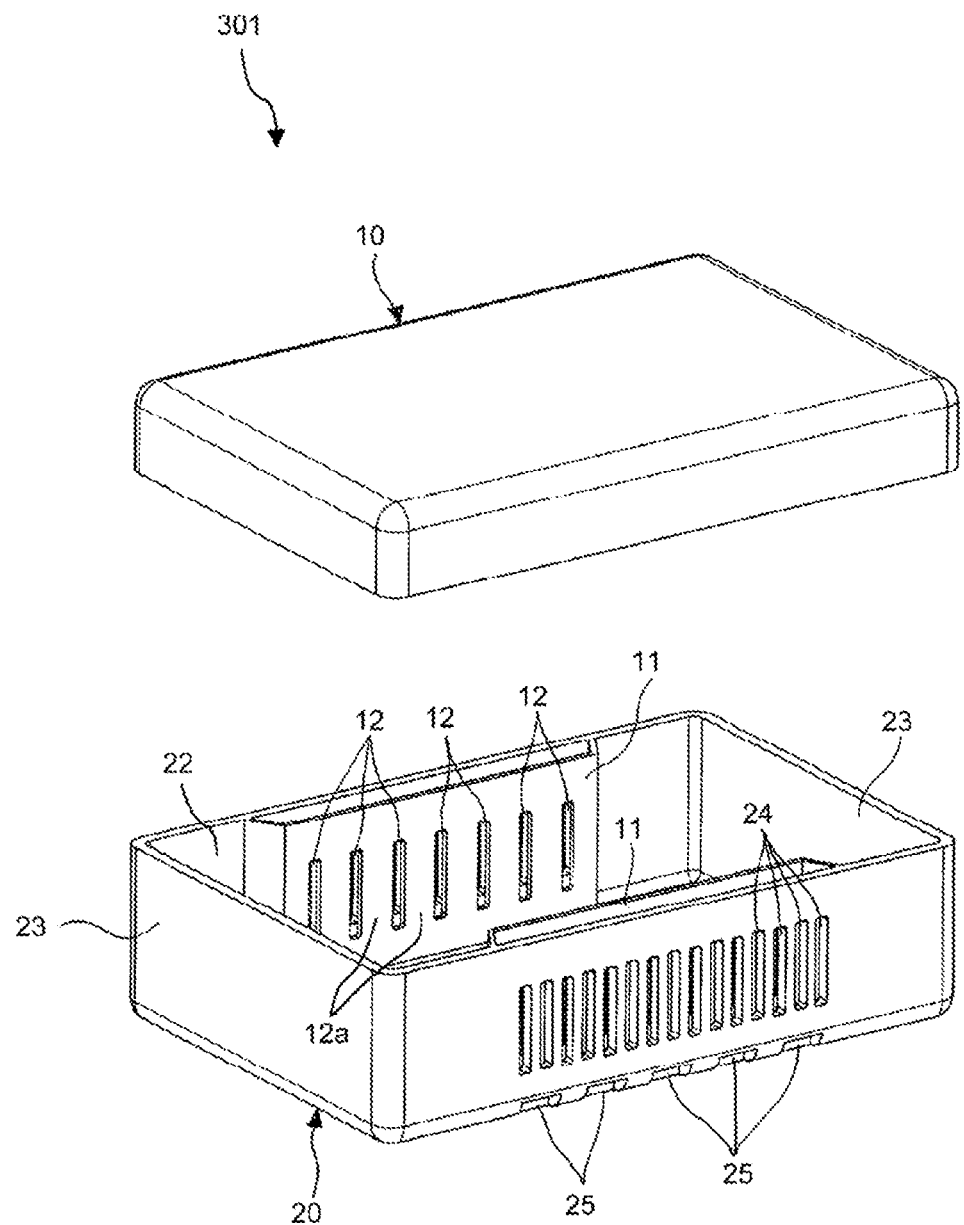
FIG. 12 is an exploded perspective view illustrating an electronic apparatus case according to an embodiment of the present technology.

As shown in FIG. 12, in the electronic apparatus case 301 according to an embodiment, the inner wall portion 11 is formed integrally with the second case body 20, and the entry prevention wall 26 included in the electronic apparatus case 1 according to an embodiment forms a part of the inner wall portion 11. That is, in the electronic apparatus case 301 according to an embodiment, the ventilation portion 3 is formed in the second case body 20.

Furthermore, in the electronic apparatus case 301 according to an embodiment, the ventilation portion 3 has a configuration such that two or more ventilation ports 24 are opposite to the intermediate wall portions 12*a* of the inner wall portion 11, but the ventilation ports 12 formed in the inner wall portion 11 is formed in a staggered manner with respect to the ventilation ports 24 formed in the long side portion 22 in the longitudinal direction of the long side portion 22.

In the electronic apparatus case 301 according to an embodiment configured as described herein, as with the electronic apparatus case 1 according to the first embodiment, even if gas is generated from the electronic apparatus housed in the electronic apparatus case 301, the gas can be released by the configuration of the ventilation portion 3. In addition to this, even if foreign substances enter, the foreign substances can be discharged to the outside by the configuration of the ventilation portion 3.

Further, only the external atmosphere can be ventilated to the inside of the electronic apparatus by providing the ventilation portion 3, so that heat generation of the electronic apparatus can be suppressed, or for example, the electronic apparatus that generates heat by continuous use can be cooled.

Figure 13:
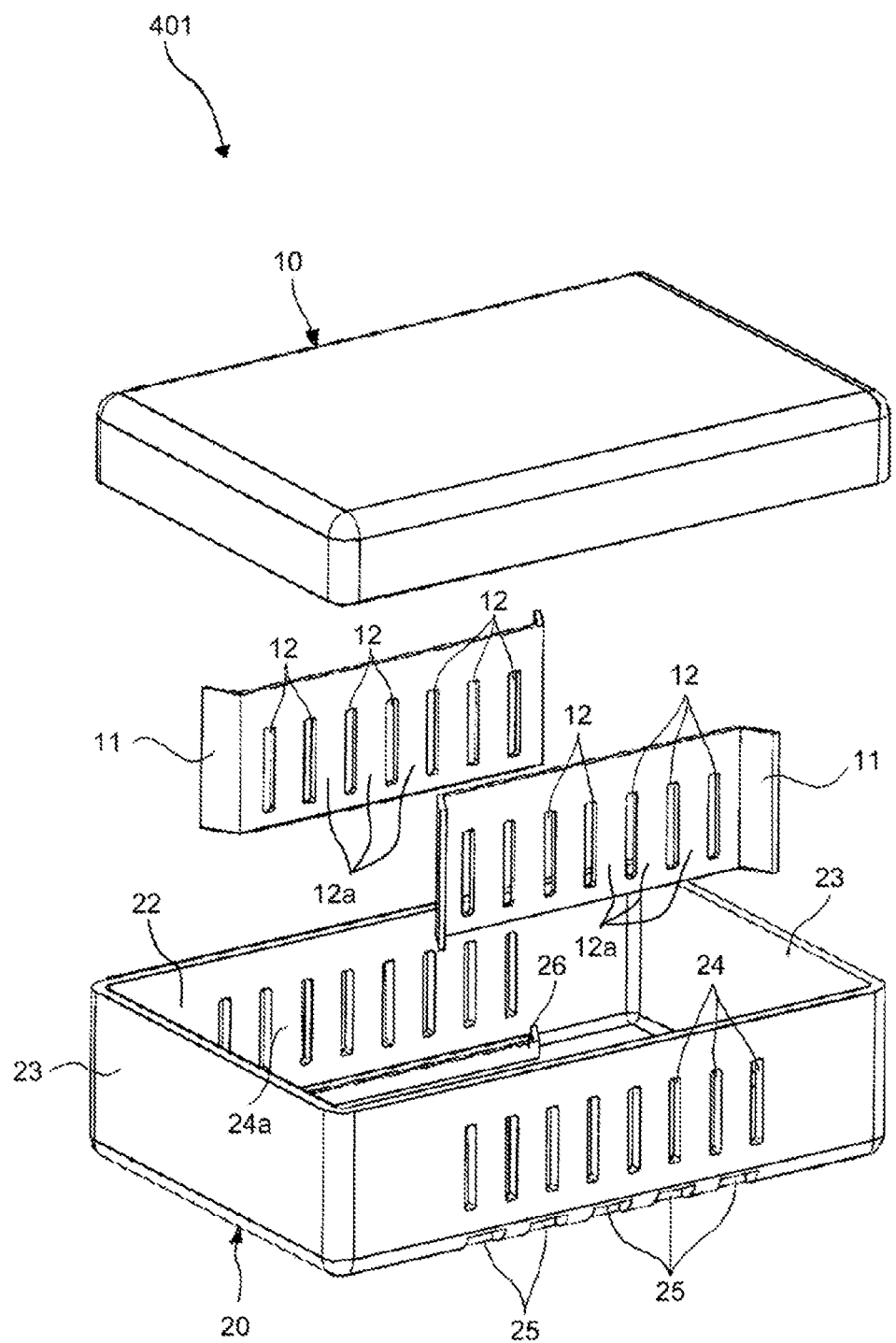
FIG. 13 is an exploded perspective view illustrating of an electronic apparatus case according to an embodiment of the present technology.

Next, the electronic apparatus case according to another embodiment of the present technology will be described with reference to FIG. 13. An electronic apparatus case 401 according to an embodiment is different from the electronic apparatus case 1 according to an embodiment only in that the inner wall portions 11 are provided separately from the first case body 10 and the second case body 20.

On the other hand, the configuration of the inner wall portion 11 itself and the configuration of other portions are the same as those in the electronic apparatus case 1 according to an embodiment.

Therefore, in the following description, the same components as those of the electronic apparatus case 1 according to an embodiment will not be described, and are denoted by the same reference numerals in the drawings.

The electronic apparatus case 401 according to an embodiment includes a first case body 10, a second case body 20 combined with the first case body 10, and inner wall portions 11 formed into a plate shape, and each of the inner wall portions 11 and the second case body 20 are combined with each other to complete the ventilation portion 3.

In the electronic apparatus case 401 according to an embodiment, the ventilation portion 13 preferably includes a mechanism for positioning and fixing each of the inner wall portions 11 so that each of the ventilation ports 12 of the inner wall portion 11 and each of the ventilation ports 24 of the long side portion 22 are disposed in a staggered manner in the longitudinal direction of the long side portion 22. As the mechanism, a publicly known configuration can be adopted, and for example, a mechanism is conceivable in which a groove portion is provided such that the inner wall portion 11 is fitted to the first case body 10.

In the electronic apparatus case 401 according to an embodiment configured as described herein, as with the electronic apparatus case 1 according to an embodiment, even if gas is generated from the electronic apparatus housed in the electronic apparatus case 401, the gas can be released by the configuration of the ventilation portion 3. In addition to this, even if foreign substances enter, the foreign substances can be discharged to the outside by the configuration of the ventilation portion 3.

Further, only the external atmosphere can be ventilated to the inside of the electronic apparatus by providing the ventilation portion 3, so that heat generation of the electronic apparatus can be suppressed, or for example, the electronic apparatus that generates heat by continuous use can be cooled.

In the electronic apparatus case 401 according to an embodiment, the inner wall portion 11 is formed separately from the case bodies 10, 20. In other words, the inner wall portion 11 is configured to be detachably attached to the case bodies 10, 20.

Here, for example, there is a possibility that ventilation of external atmosphere is prevented by depositing of foreign substances on the inner wall portion 11 due to the nature of the foreign substances or the like. In such a case, it is possible to prevent obstruction of ventilation due to the deposition of the foreign substances only by replacing the inner wall portion 11 formed separately from the first case body 10 and the second case body 20.

Next, the electronic apparatus case according to an embodiment of the present technology will be described with reference to FIG. 14.

In the electronic apparatus case according to embodiments of the present technology, the ventilation portion 3 including the long side portion 22 (outer wall portion), the inner wall portion 11, and the discharge port 25 is provided on the side surface of the electronic apparatus case; however, the ventilation portion 3 may be formed on any surface of the case body in an embodiment.

Figure 14:
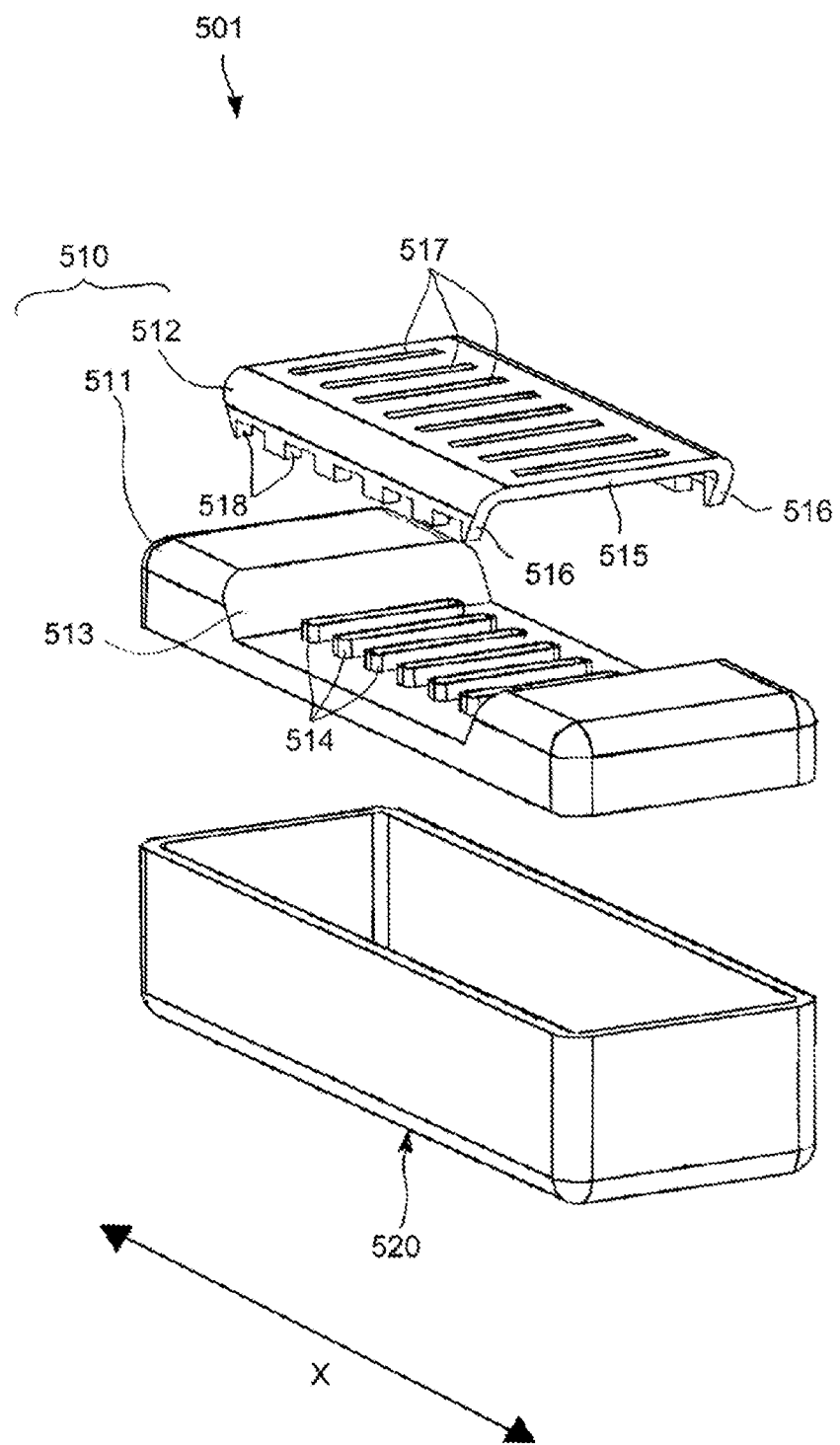
FIG. 14 is an exploded perspective view illustrating of an electronic apparatus case according to an embodiment of the present technology.

The electronic apparatus case 501 according to an embodiment shown in FIG. 14 adopts a configuration in which the ventilation portion 3 is formed on the upper surface of the electronic apparatus case.

The electronic apparatus case 501 according to an embodiment includes a first case body 510 provided with the ventilation section 3 and a second case body 520 that is combined with the first case body 510 to constitute the electronic apparatus case. The second case body 520 is formed into a box shape with one surface opened.

On the other hand, the first case body 510 includes a main body portion 511 closing the opening of the second case body 520 and a lid portion 512 fitted to the main body portion 511. Hereinafter, the main body portion 511 and the lid portion 512 will be described according to an embodiment.

The main body portion 511 is formed so as to cover the opening of the second case body 520, and is formed into a substantially rectangular shape.

In addition, in the main body portion 511, a recessed portion 513 is formed in the longitudinal center of the main body portion 511. The lid portion 512 is fit into the recessed portion 513.

Further, in an embodiment, a plurality of ventilation ports formed into a long hole shape are formed in the recessed portion 513 (not shown), and the plurality of ventilation ports are arranged at predetermined intervals along the longitudinal direction (arrow X direction) of the main body portion 511. Each of the ventilation ports is formed penetratingly to the main body portion 511, and the opening direction of the ventilation port is coincident with a direction perpendicular to the longitudinal direction of the main body portion 511.

In addition, entry prevention portions 514 protruding toward the lid portion 512 are formed on the entire circumference of the edge of the ventilation port. The entry prevention portions 514 prevent foreign substances coming from the outside from entering the inside of the electronic apparatus case through the ventilation ports.

On the other hand, in an embodiment, the lid portion 512 has a base portion 515 formed into a substantially rectangular shape along the longitudinal direction, and a pair of side wall portions 516 suspended from the base portion 515, and is formed to have a substantially U-shaped cross section.

A plurality of ventilation ports 517 formed into a long hole shape are formed in the base portion 515, and the plurality of ventilation ports 517 are arranged at predetermined intervals along the longitudinal direction (arrow X direction) of the lid portion 512. Each of the ventilation port 517 penetrates the base portion 515, and the opening direction of the ventilation port 517 is coincident with a direction perpendicular to the longitudinal direction of the main body portion 511.

In an embodiment, an entry prevention portion protruding toward the main body portion 511 is formed on the entire circumference of the edge of the ventilation port 517.

Furthermore, a plurality of notch portions 518 are formed on an end surface of each of the side wall portions 516, and the plurality of notch portions 518 are arranged at predetermined intervals along the longitudinal direction (arrow direction X) of the lid portion 512.

In the first case body 510 configured as described herein, as with the case of the electronic apparatus case according to an embodiment, the ventilation portion is completed by fitting the lid portion 512 to the main body portion 511.

In the electronic apparatus case 501 according to an embodiment, the main body portion 511 corresponds to the inner wall portion of the present technology, and the lid portion 512 corresponds to the outer wall portion of an embodiment of the present technology.

Further, in a state where the lid portion 512 is fitted to the main body portion 511, the notch portions 518 formed in the lid portion 512 are closed by the recessed portion 513 of the main body portion 511, whereby the discharge port is completed.

In the ventilation portion, the ventilation ports formed in the main body portion 511 and the ventilation ports 517 formed in the lid portion 512 are formed in a staggered manner along the longitudinal direction of the first case body 510, and each of the ventilation ports formed in the main body portion 511 is opposite to a wall portion formed between a pair of adjacent ventilation ports 517 formed in the lid portion 512. On the other hand, the ventilation ports 517 formed in the lid portion 512 are opposite to a wall portion formed between a pair of adjacent ventilation ports formed in the main body portion 511.

In the electronic apparatus case 501 according to an embodiment configured as described herein, foreign substances coming from the ventilation ports 517 of the first case body 510 are positively guided toward a wall portion formed between a pair of adjacent ventilation ports formed in the main body portion 511 by the entry prevention portions formed in the first case body 510, and collide with the wall portion.

Thereafter, the foreign substances having collided with the wall portion move from above the recessed portion 53 to the discharge port by their own weight, and finally are discharged to the outside of the electronic apparatus case.

In the electronic apparatus case 501 according to an embodiment, as with the electronic apparatus case 1 according to an embodiment, even if gas is generated from the electronic apparatus housed in the electronic apparatus case 501, the gas can be released by the configuration of the ventilation portion. In addition to this, even if foreign substances enter, the foreign substances can be discharged to the outside by the configuration of the ventilation portion.

Further, only the external atmosphere can be ventilated to the inside of the electronic apparatus by providing the ventilation portion, so that heat generation of the electronic apparatus can be suppressed, or for example, the electronic apparatus that generates heat by continuous use can be cooled.

In the electronic apparatus case 501 according to an embodiment shown in FIG. 14, the entry preventing portions are formed at the edge of each of the ventilation ports of the main body portion 511 and at the edge of each of the ventilation ports 517 of the lid portion 512; however, these entry prevention portions are not essential components and may not be provided. Alternatively, in an embodiment, the entry prevention portions are formed on at least one of the main body portion 511 and the lid portion 512.

In the electronic apparatus case 501 according to an embodiment shown in FIG. 14, each of the entry preventing portions is formed into a protrusion shape; however, the shape of each of the entry prevention portions is not particularly limited, and other shapes can be adopted as long as the entry preventing portions can prevent foreign substances having passed through the ventilation ports 517 of the lid portion 512 from entering the inside of the electronic apparatus case.

In the electronic apparatus case 501 according to an embodiment shown in FIG. 14, the ventilation portion is formed on the upper surface of the electronic apparatus case and is not formed on the side surface of the electronic apparatus case, but in the electronic apparatus case 501, the ventilation portion may be formed on the side surface of the electronic apparatus case 501. In such a case, it is conceivable to form a ventilation portion on at least one surface of the second case body 520.

Furthermore, in the electronic apparatus case 501 according to an embodiment, since the ventilation portion is formed on the upper surface of the electronic apparatus case 501, there is a possibility that foreign substances coming from the ventilation ports 517 deposit in the recessed portion 513.

Therefore, in the electronic apparatus case 501 according to an embodiment, for example, the bottom surface of the recessed portion 513 may be formed into a curved convex shape so that the foreign substances colliding with the recessed portion 513 are positively moved to the discharge port. Alternatively, in an embodiment, a configuration such as a tapered surface inclined with a predetermined gradient toward the discharge port in the recessed portion 513 may be considered.

Next, a variation of the electronic apparatus case 501 according to an embodiment will be described with reference to FIG. 15.

Figure 15:
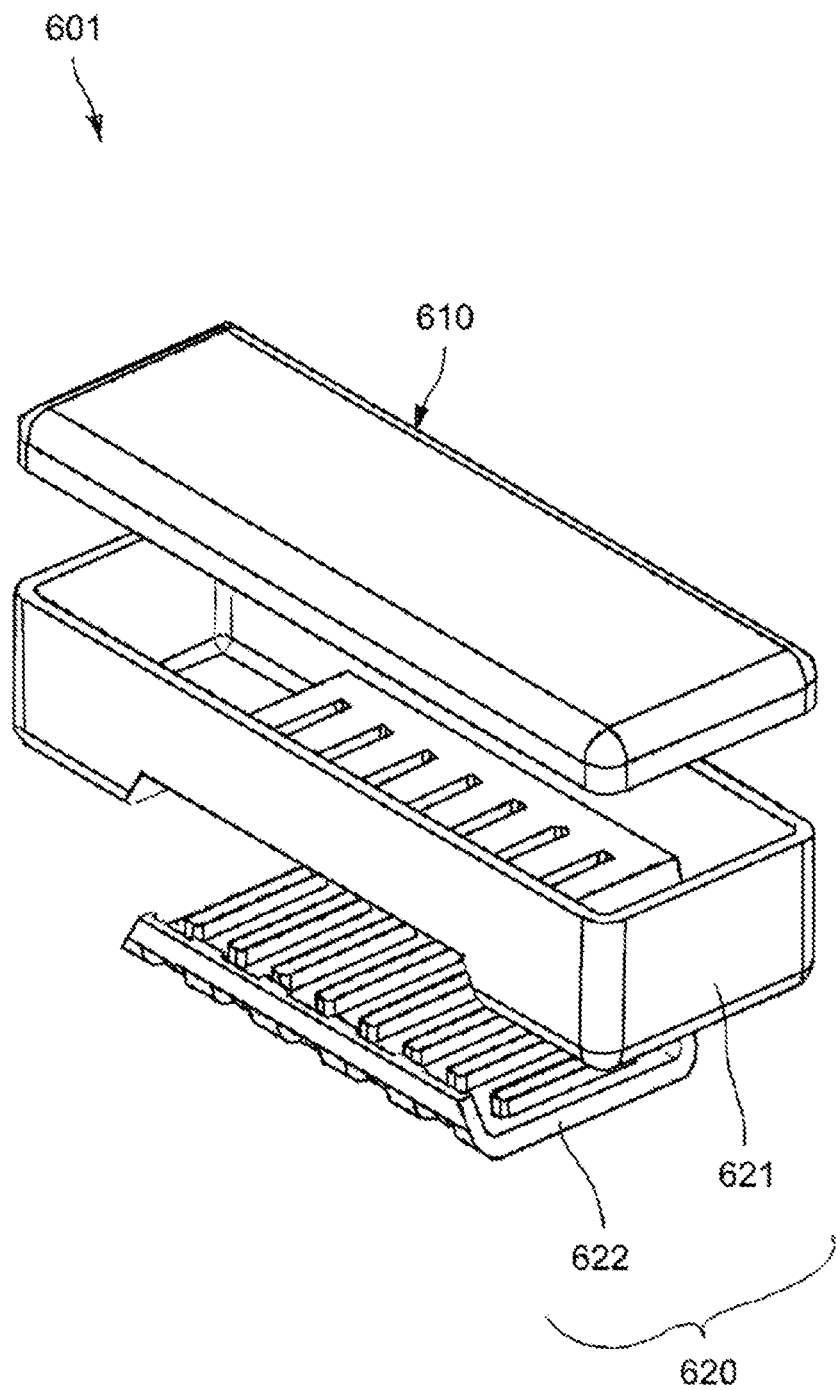
FIG. 15 is an exploded perspective view illustrating an embodiment of the electronic apparatus case shown in FIG. 14.

In the electronic apparatus case 501 according to an embodiment, the ventilation portion is formed on the upper surface of the electronic apparatus case, whereas in a variation 601 shown in FIG. 15, the ventilation portion is formed on the lower surface of the electronic apparatus case.

An electronic apparatus case 601 according to an embodiment includes a first case body 610 formed into a lid shape with one surface opened, and a second case body 620 provided with the ventilation portion and fitted to the first case body 610. The second case body 620 is provided with the configuration of the first case body 510 of the electronic apparatus case 501 according to an embodiment.

That is, the second case body 620 shown in FIG. 15 includes a main body portion 621 to be combined with the first case body 610 and a lid portion 622 to be fitted to the main body portion 621.

Since the configurations of the main body portion 621 and the lid portion 622 are the same as the configurations of the main body portion 511 and the lid portion 512 included in the electronic apparatus case 501 according to the fifth embodiment shown in FIG. 14, the description thereof will be omitted here.

In the electronic apparatus case 601 according to an embodiment, as with the electronic apparatus case 1 according to an embodiment, even if gas is generated from the electronic apparatus housed in the electronic apparatus case 601, the gas can be released by the configuration of the ventilation portion. In addition to this, even if foreign substances enter, the foreign substances can be discharged to the outside by the configuration of the ventilation portion.

Further, only the external atmosphere can be ventilated to the inside of the electronic apparatus by providing the ventilation portion, so that heat generation of the electronic apparatus can be suppressed, or for example, the electronic apparatus that generates heat by continuous use can be cooled.

Figure 16:
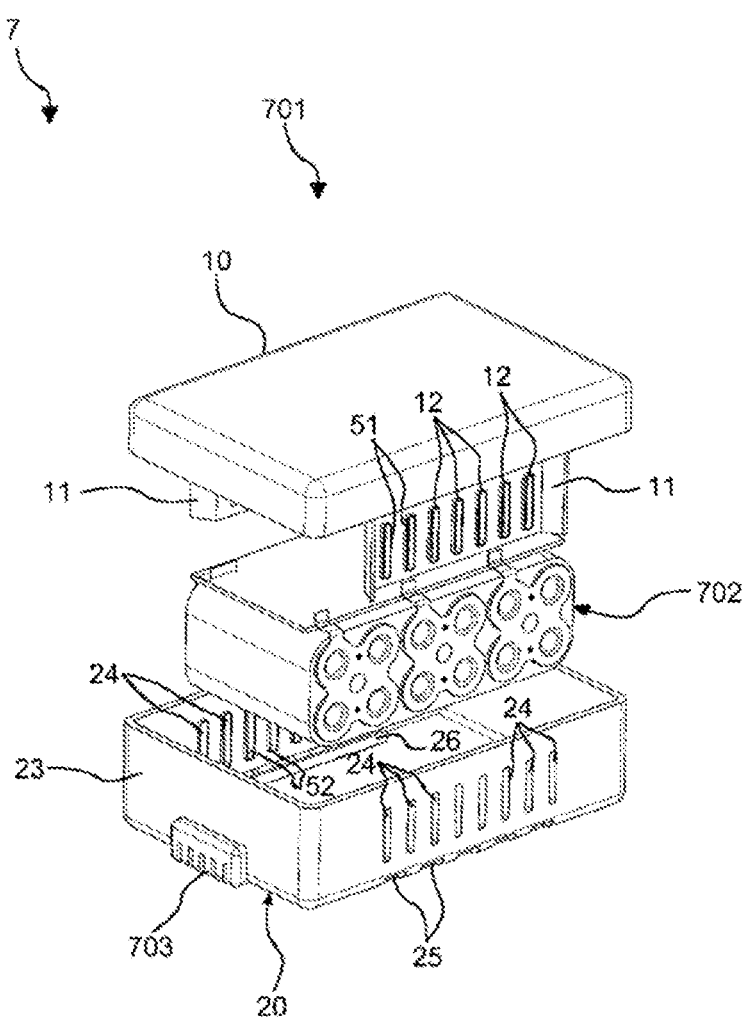
FIG. 16 is an exploded perspective view illustrating a battery pack according to an embodiment of the present technology.

The present technology also provides a battery pack. FIG. 16 is an exploded perspective view showing a battery pack according to an embodiment of the present technology, and a battery pack 7 includes an electronic apparatus case 701 and a battery 702 housed in the electronic apparatus case. Hereinafter, the electronic apparatus case 701 and the battery 702 will be described. In addition, a reference numeral 703 in FIG. 16 indicates an input/output terminal to be connected to the battery 702. the configuration of the battery pack according to an embodiment of the present technology is not limited to the electronic apparatus case 701 and the battery 702. In an embodiment, the battery pack includes a lead wire and a connector for connecting the battery 702 to a predetermined circuit board, and the like which are mounted on a normal battery pack.

The electronic apparatus case 701 included in the battery pack 7 shown in FIG. 16 has the same configuration as that of the electronic apparatus case 201 according to an embodiment shown in FIG. 9. Therefore, the same components are denoted by the same reference numerals, and the description of each component will be omitted. Here, not only the electronic apparatus case 201 according to an embodiment shown in FIG. 9 but also electronic apparatus cases according to other embodiments can be applied as the electronic apparatus case included in the battery pack according to an embodiment of the present technology.

The battery pack 7 according to an embodiment of the present technology includes the battery 702. The battery 702 is housed in the first case body 10 and the second case body 20 in a state of being sandwiched between a pair of the inner wall portions 11 included in the electronic apparatus case 1.

The battery 702 is not particularly limited, and examples thereof include primary batteries such as a manganese dry battery, an alkaline manganese dry battery, and a lithium primary battery; and secondary batteries such as a nickel-cadmium battery, a nickel-metal hydride battery, a nickel-zinc battery, a lead battery, a lithium secondary battery, a lithium ion secondary battery, and a lithium ion polymer secondary battery. A lithium ion secondary battery is preferably used in the battery pack according to the present technology.

Alternatively, the secondary battery also includes an assembled battery having a plurality of single batteries connected in series, and the like.

FIG. 16 shows an example in which an assembled battery having a plurality of single batteries connected in series is used as the battery 702.

In the battery pack 7 according to an embodiment of the present technology, even if gas is generated from the battery 702, the gas can be released by the configuration of the ventilation portion.

In addition to this, even if foreign substances enter, the foreign substances can be discharged to the outside by the configuration of the ventilation portion. As a result, it is possible to prevent contact between the battery 702 and the foreign substances, so that the deterioration of the battery 702 can be prevented.

Furthermore, in the battery pack 7 according to an embodiment of the present technology, the electronic apparatus case 1 has the ventilation portions, so that only external atmosphere can be ventilated to the inside. Accordingly, heat generation of the battery 702 can be suppressed, or for example, the battery 702 that generates heat by continuous use can be cooled.

The present technology is described below in further detail according to an embodiment.

(1)

An electronic apparatus case, comprising:
a ventilation portion provided on at least one side of the electronic apparatus case, in which
the ventilation portion includes:
an outer wall portion including a first ventilation port;
an inner wall portion including with a second ventilation port provided in a staggered manner with respect to the first ventilation port of the outer wall portion; and
a discharge port provided between the outer wall portion and the inner wall portion.

(2)

The electronic apparatus case according to (1), in which the second ventilation port of the inner wall portion is provided in a staggered manner with respect to the first ventilation port of the outer wall portion in a longitudinal direction of the outer wall portion.

(3)

The electronic apparatus case according to (1) or (2), including an entry prevention portion configured to prevent a foreign substance from entering on one or both of an edge of the second ventilation port of the inner wall portion and an edge of the first ventilation port of the outer wall portion.

(4)

The electronic apparatus case according to any one of (1) to (3), further including a filter member configured to reduce an entry speed of a foreign substance, in which the filter member is opposite to one or both of the second ventilation port of the inner wall portion and the first ventilation port of the outer wall portion.

(5)

The electronic apparatus case according to (4), in which the filter member is provided between the outer wall portion and the inner wall portion.

(6)

The electronic apparatus case according to (4), in which the filter member is opposite to only the first ventilation port of the outer wall portion.

(7)

The electronic apparatus case according to any one of (1) to (6), including a pair of case bodies combined with each other, in which the ventilation portion is provided in at least one of the case bodies.

(8)

The electronic apparatus case according to any one of (1) to (6), including a pair of case bodies combined with each other, in which the inner wall portion is provided separately from the pair of case bodies.

(9)

The electronic apparatus case according to any one of (1) to (6), including a pair of case bodies combined with each other, in which the inner wall portion is provided integrally with any one of the case bodies.

(10)

The electronic apparatus case according to any one of (1) to (9), including an entry prevention wall surrounding the discharge port.

(11)

The electronic apparatus case according to any one of (3) to (10), in which the entry prevention portion includes protrusion shape.

(12)

The electronic apparatus case according to any one of (3) to (10), in which the entry prevention portion includes a step portion.

(13)

A battery pack including:

an electronic apparatus case; and a battery housed in the electronic apparatus case, in which the electronic apparatus case includes a ventilation portion provided on at least one side of the electronic apparatus case, and the ventilation portion includes:

an outer wall portion including a plurality of first ventilation ports;

an inner wall portion including a plurality of second ventilation ports provided in a staggered manner with respect to the first ventilation ports of the outer wall portion; and a discharge port provided between the outer wall portion and the inner wall portion.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. An electronic apparatus case, comprising:
a ventilation portion provided on at least one side of the electronic apparatus case, wherein
the ventilation portion includes:
an outer wall portion including a first ventilation port;
an inner wall portion including a second ventilation port provided in a staggered manner with respect to the first ventilation port of the outer wall portion;
a discharge port provided between the outer wall portion and the inner wall portion, and
an intermediate wall portion provided between a pair of adjacent first ventilation ports,
wherein the discharge portion is provided below the intermediate wall portion.

2. The electronic apparatus case according to claim 1, wherein the second ventilation port of the inner wall portion is provided in a staggered manner with respect to the first ventilation port of the outer wall portion in a longitudinal direction of the outer wall portion.

3. The electronic apparatus case according to claim 1, further comprising an entry prevention portion, wherein an entry prevention portion is configured to prevent a foreign substance from entering on one or both of an edge of the second ventilation port of the inner wall portion and an edge of the first ventilation port of the outer wall portion.

4. The electronic apparatus case according to claim 3, wherein the entry prevention portion includes a protrusion shape.

5. The electronic apparatus case according to claim 3, wherein the entry prevention portion includes a step portion.

6. The electronic apparatus case according to claim 1, further comprising a filter member configured to reduce an entry speed of a foreign substance, wherein
the filter member is opposite to one or both of the second ventilation port of the inner wall portion and the ventilation port of the outer wall portion.

7. The electronic apparatus case according to claim 6, wherein the filter member is provided between the outer wall portion and the inner wall portion.

8. The electronic apparatus case according to claim 1, further comprising a filter member, wherein the filter member is opposite to only the first ventilation port of the outer wall portion.

9. The electronic apparatus case according to claim 1, comprising a pair of case bodies in combination thereof, wherein
the ventilation portion is provided in at least one of the case bodies.

10. The electronic apparatus case according to claim 1, comprising a pair of case bodies in combination thereof, wherein the inner wall portion is provided separately from the pair of case bodies.

11. The electronic apparatus case according to claim 1, comprising a pair of case bodies in combination thereof, wherein
the inner wall portion is provided integrally with one of the case bodies.

12. The electronic apparatus case according to claim 1, further comprising an entry prevention wall surrounding the discharge port.

13. A device comprising:
an electronic apparatus case; and
a battery housed in the electronic apparatus case, wherein
the electronic apparatus case includes a ventilation portion provided on at least one side of the electronic apparatus case, and
wherein the ventilation portion includes:
an outer wall portion including a plurality of first ventilation ports;
an inner wall portion including a plurality of second ventilation ports provided in a staggered manner with respect to the first ventilation ports of the outer wall portion; and
a discharge port provided between the outer wall portion and the inner wall portion, and
an intermediate wall portion provided between a pair of adjacent first ventilation ports,
wherein the discharge portion is provided below the intermediate wall portion.

14. The device according to claim 13, wherein the second ventilation ports of the inner wall portion are provided in a staggered manner with respect to the first ventilation ports of the outer wall portion in a longitudinal direction of the outer wall portion.

15. The device according to claim 13, further comprising an entry prevention portion, wherein the entry prevention portion is configured to prevent a foreign substance from entering on an edge of the second ventilation ports of the inner wall portion or an edge of the first ventilation ports of the outer wall portion.

16. The device according to claim 13, further comprising a filter member configured to reduce an entry speed of a foreign substance, wherein
the filter member is opposite to the second ventilation ports of the inner wall portion.

17. The device according to claim 13, further comprising a terminal configured to electrically connect with the battery.

* * * * *